United States Patent [19]

Denbaars et al.

[11] Patent Number: 5,650,198
[45] Date of Patent: Jul. 22, 1997

[54] DEFECT REDUCTION IN THE GROWTH OF GROUP III NITRIDES

[75] Inventors: Steven P. Denbaars; James S. Speck, both of Goleta, Calif.

[73] Assignee: The Regents of the University of California, Oakland, Calif.

[21] Appl. No.: 516,794

[22] Filed: Aug. 18, 1995

[51] Int. Cl.$^6$ ............................................. C23C 16/34
[52] U.S. Cl. ................................ 427/255.2; 427/255.7
[58] Field of Search ........................... 427/126.1, 248.1, 427/255.2, 255.7

[56] References Cited

U.S. PATENT DOCUMENTS

| | | | |
|---|---|---|---|
| 4,863,755 | 9/1989 | Hess et al. | 427/39 |
| 5,082,798 | 1/1992 | Arimoto | 437/110 |
| 5,106,453 | 4/1992 | Benko et al. | 156/613 |
| 5,141,569 | 8/1992 | Ito et al. | 148/33 |
| 5,141,893 | 8/1992 | Ito et al. | 437/81 |
| 5,154,949 | 10/1992 | Shindo et al. | 427/253 |
| 5,178,911 | 1/1993 | Gordon et al. | 427/255.2 |
| 5,179,042 | 1/1993 | Mikoshiba et al. | 437/187 |
| 5,196,372 | 3/1993 | Mikoshiba et al. | 437/187 |
| 5,268,039 | 12/1993 | Vogeli et al. | 135/256 |
| 5,296,088 | 3/1994 | Kodama et al. | 156/613 |
| 5,305,341 | 4/1994 | Nishikawa et al. | 372/45 |
| 5,343,055 | 8/1994 | Davis et al. | 257/186 |
| 5,379,720 | 1/1995 | Kuramata | 117/104 |
| 5,402,748 | 4/1995 | Takai et al. | 117/84 |

OTHER PUBLICATIONS

I. Akasaki, et al. Effects of ain buffer layer on crystallographic structure and on electrical and optical properties of GaN and $Ga_{1-x}Al_xN$ ($0<_x\leq0.4$). Journal of Crystal Growth 98 (1989) 209–219, North Holland, Amsterdam. (Month unavailable).

*Properties of Group III Nitrides*, by James H. Edgar, ed., INSPEC, the Institution of Electrical Engineers, London, United Kingdom, 1994, (Month unavailable) (Table of Contents).

S. Nakamura, et al. *Applied Physics Letters*, vol. 58, #18, 6 May 1991.

K. Hirosowa, et al. in *Journal of Applied Physics*, vol. 32 #8A, pp. L1039–L1042 1 Aug. 1993.

Hiroshi Amano, Tsunemori Asahi and Isamu Akasaki, Stimulated Emission Near Ultraviolet at Room Temperature from a GaN Film Grown on Sapphire by MOVPE Using an AIN Buffer Layer, *Japanese Journal of Applied Physics*, vol. 29, No. 2, Feb. 1990, pp. L205–L206.

Shuji Nakamura, Takashi Mukai, and Masayuki Senoh, Candela–class high–brightness InGaN/AlGaN double–heterostructure blue–light–emitting diodes, *Appl. Phys. Lett* 64 (13), 28 Mar. 1994, pp. 1687–1689.

*Primary Examiner*—S. Beck
*Assistant Examiner*—Timothy Meeks
*Attorney, Agent, or Firm*—Peters, Verny, Jones & Biksa, L.L.P.

[57] ABSTRACT

The present invention relates to an improved method to produce Group III nitride thin film having a lower defect density, which method comprises:

(a) combining under metalorganic chemical vapor deposition (MOCVD) conditions at least one Group III metalorganic compound with ammonia, hydrazine, nitrogen-hydrogen, or combinations thereof in a molar ratio of between about 1/10000 and 2/1 of metalorganic to the ammonia, hydrazine, nitrogen-hydrogen, or combinations thereof, at a low pressure of about 100 torr or less, to produce a first nitride layer;

(b) combining under metalorganic chemical vapor deposition conditions at least one Group III metalorganic compound with ammonia, hydrazine, nitrogen-hydrogen, or combinations thereof in a molar ratio of between about 1/10000 and 2/1 of metalorganic to the ammonia, hydrazine, nitrogen-hydrogen, or combinations thereof, at a high pressure of about 700 to 760 torr or greater for between about 5 and 60 min to produce a nitride layer having a reduced defect density and;

(c) repeating steps (a) and (b) to produce a Group III metal nitride having a reduced defect density of less than half of the defects observed wherein high and low pressure cycling is not used.

14 Claims, 1 Drawing Sheet

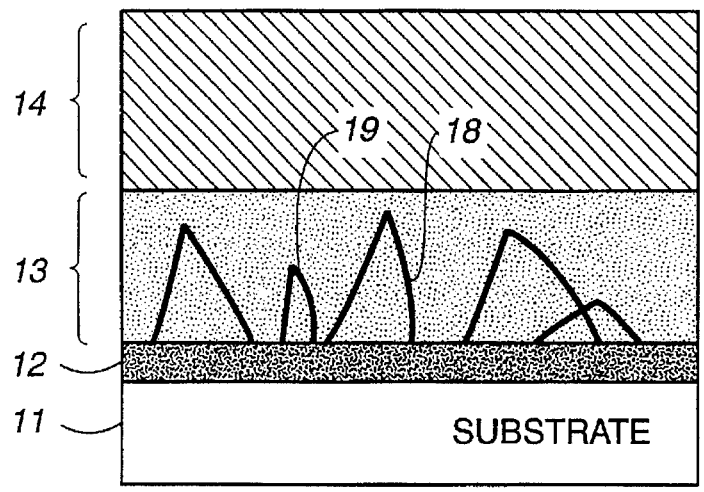
FIG._1
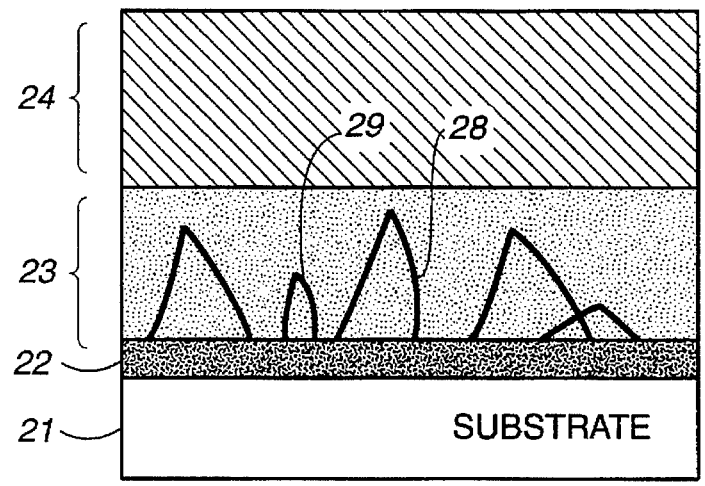
FIG._2
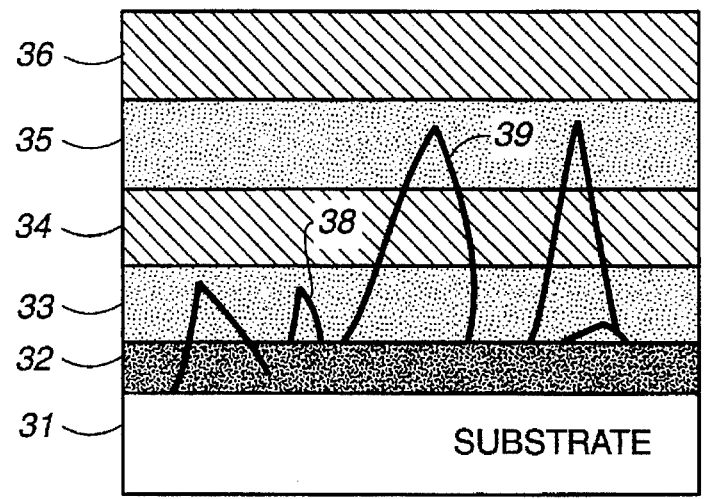
FIG._3

DEFECT REDUCTION IN THE GROWTH OF GROUP III NITRIDES

BACKGROUND OF THE INVENTION

1. Field of Invention

The present invention concerns an improved process to reduce the number of defects in a Group III nitride (e.g. GaN) with a corresponding improvement in the electrical, optical and mechanical properties of the formed nitride. Specifically, reduction is achieved when the thin layer is first formed at low pressure, then subjected to further formation using a higher pressure (with alternating use of low pressure and high pressure as needed).

2. Background Art and Related Art Disclosures

Prior art in the metalorganic chemical vapor deposition (MOCVD) growth of III–V nitride thin films typically use a single low temperature buffer layer for nucleating the film growth. The reactor pressure is typically atmospheric pressure or low pressure (100 torr or less).

For general information, see for example:

S. Nakamura et al., *Applied Physical Letters*, vol. 64 (#13), p. 1687–1682 (28 Mar. 1994) discloses the use of conventional MOCVD to produce candela-class high brightness InGaN/AlGaN double-heterostructure blue-light-emitting disorders.

H. Amano, et al., in *Japanese Journal of Applied Physics*, vol. 29 (#2), pp. L205–L206 (February 1990) disclose the preparation of GaN film grown on sapphire by conventional metal organic vapor phase epitaxy (MOVPE). The layer has room temperature stimulated emission near UV. This indicates the GaN film is promising as a UV laser diode.

D. Hess et al. in U.S. Pat. No. 4,863,755, describe the general and accepted chemical vapor deposition apparatus, configuration, and technique to produce thin films.

*Properties of Group III Nitrides*, by James H., Edgar, ed., INSPEC, the Institution of Electrical Engineers, London, United Kingdom, 1994, describe many aspects of nitride structure, including defects. Chemical vapor deposition (CVD) and metalorganic chemical vapor deposition (MOCVD) are known in the art. Additional references of interest as background to assist one of skill in this art include U.S. Pat. Nos.: 5,402,748; 5,379,720; 5,343,055; 5,305,341; 5,296,088; 5,268,039; 5,196,372; 5,179,042; 5,154,949; 5,141,893; 5,141,569; 5,106,453; and 5,082,798.

All references, articles, papers, patents, standards, etc. cited in this application are incorporated herein by reference.

No reports on varying the pressure of the process during the growth with the intent of reducing the defect density have been reported.

It is therefore apparent that a need exists for an improved process to reduce the defects in Group III nitrides and to improve desirable properties. The present invention accomplishes these objectives.

SUMMARY

The present invention relates to an improved method to produce Group III nitride thin film having a lower defect density, which method comprises:

(a) combining under metalorganic chemical vapor deposition (MOCVD) conditions at least one Group III metalorganic compound with ammonia, hydrazine, nitrogen-hydrogen, alkylamine or combinations thereof in a III/V molar ratio of between about 1/10000, and 2/1 (metalorganic/ammonia, hydrazine, nitrogen-hydrogen, alkylamine, or combinations thereof) at a low pressure of about 100 torr or less, to produce a first Group III nitride layer for between about 5 and 60 min;

(b) combining under metalorganic chemical vapor deposition conditions at least one Group III metalorganic compound with ammonia, hydrazine, nitrogen-hydrogen, alkylamine or combinations thereof in a ratio of between about 1/10000 and 2/1 (metalorganic/ammonia, hydrazine, nitrogen-hydrogen, alkylamine or combinations thereof) at a high pressure of about 700 to 10,000 torr for between about 5 and 60 min to produce a Group nitride layer having a reduced defect density, and (c) repeating steps (a) and (b) to produce a Group III metal nitride, having a reduced defect density of less than half of the defects obtained compared to a Group III metal nitride is produced wherein high and low pressure cycling is not used.

In a preferred embodiment, in the metal organic compound, the organic groups are alkyl groups having 1 to 6 carbon atoms.

BRIEF DESCRIPTION OF DRAWINGS

FIG. 1 is a schematic cross-sectional representation of crystal structure produced by the present invention.

FIG. 2 is a schematic cross-sectional representation of Group III nitrides using variable V/III ratio layers as a means to modulate and reduce point defects.

FIG. 3 is a schematic cross-sectional representation of Group III nitrides using alternating layers of variable point defect concentrations.

DETAILED DESCRIPTION OF THE INVENTION AND PREFERRED EMBODIMENTS

Definitions

As used herein:

"Aluminum precursor compound" refers to volatile aluminum hydrides or mono-, di-, or tri-alkyl aluminum compounds wherein alkyl has 1 to 6 carbon atoms.

"Boron precursor compound" refers to volatile hydrogen and/or organic boron compounds or mono-, di-, or tri-alkyl boron compounds wherein alkyl has 1 to 6 carbon atoms.

"Alkyl amine" refers to mono-, di-, or tri-alkyl substituted amines wherein alkyl has 1 to 6 carbon atoms.

"Gallium precursor compound" refers to volatile organic gallium compounds or mono-, di-, or tri-alkyl gallium compounds wherein alkyl has 1 to 6 carbon atoms.

"Group III metal" or "Column III metal" refers to boron, aluminum, gallium, indium, any of the lanthanum series, or combinations thereof. Aluminum, gallium, indium, and combinations thereof are preferred.

"Indium precursor compound" refers to volatile organic substituted indium compounds, preferably alkyl indium compounds wherein alkyl has 1 to 6 carbon atoms.

The present invention uses a variable pressure metalorganic chemical vapor deposition (MOCVD) process to produce a high point defect layer to promote dislocation annihilation followed by the growth of a higher quality low point defect layer of improved quality. Low-pressure MOCVD and or low ammonia to Group III metalorganic ratios leads to films with strong mid-gap photoluminescence which is indicative of a high concentration of nitrogen vacancies. High point defect concentration leads to enhanced dislocation climb rates and consequently to enhanced dislocation annihilation. High-pressure MOCVD growth is deposited on the lower dislocation density material which results in further improvements in the optical and electrical properties. (See FIG. 1)

In referring to FIG. 1, it is seen that the layer is formed on a substrate 11 preferably sapphire or material with a similar crystal structure. Optionally, a buffer layer 12 is used to coat the substrate. The buffer layer can be of any material, however low temperature gallium nitride GaN or aluminum nitride AlN is generally used. Zone 13 shows the high point defect region and high dislocastion annihilation (using low pressure MOCVD). Dislocations 18 and 19 will disappear in zone 13 and zone 13 has a high defect region.

Zone 14 shows a low point dislocation density region (from high pressure MOCVD). In effect inn zone 13 at low pressure is created the high point defect density which is more amenable to reducing defects in the high pressure step.

Referring to FIG. 2 (which shows a similar pattern to FIG. 1), it is seen that the layer is formed on a substrate 21, preferably sapphire or a material with a similar crystal structure. Optionally, a buffer layer 22 is coated on substrate 21. Preferably, buffer layer 22 is a low temperture GaN or AlN. Zone 23 shows the region of high point defect using low compound V/III ratio MOCVD). Zone 24 is a low point defect region 1 using high compound V/III ratio MOCVD.

Dislocation densities 28 and 29 are annihiliated at low pressure creating high defect densities in zone 23. Under low V/III ratio MOCVD of the high defect zone 23 dislocations 28 and 29 disappear. In zone 24 using a high V/III ratio, the defects are low and the defects in zone 23 are also reduced.

Referring to FIG. 3, variations are shown of (a) varying the V/III ratio of gases and (b) using multiple layers of low point and high point defect levels. Again, substrate 31 is sapphire or a similar material. Optional buffer layer 32 is low temperature GaN or AlN. Zone 33 shows some dislocations 38 and 39. Using low pressure these dislocations will disappear and high point defects are present. Upon application of high pressure, a low point defect density layer 33 and 34 are created. Zone 35 is an area of high point defects using low pressure and a low ratio of V/III. The dislocations are annihiliated and become defect densities which are reduced by zone 36 a high ratio of V/III. The alternating layers (or zones) produce layers having improved properties.

This invention has wide spread utility in depositing Group III (e.g., gallium) nitride thin films for electronic and optoelectronic applications. These materials are used in the creation of blue and full-color light emitting devices. These materials are also used in a wide range of solid-state electronic semiconductor devices.

Preferably, in steps (a) and (b) the mole ratio of III to V in the reactants is between about 1/5000 and 2/1, more preferably between about 1/1000 and 2/1, depending on the stability of the III precursor.

Preferably, the temperature in step (a) is between about 500° and 1200° C., and more preferably between about 900° and 1200° C.

Preferably, the temperature in step (b) is between about 200° and 1200° C., more preferably between about 500° and 1200° C., especially between about 900° and 1200° C.

Preferably, the pressure in step (a) is between about 1 and 300 torr, more preferably between about 1 and 200 torr and especially between about 1 and 100 torr.

Preferably the pressure in step (b) is between about 700 and 10,000 torr, and more preferably between about 700 and 800 torr.

The following Examples are presented for the purposes of explanation and illustration only. These are not to be construed to be limiting in any way.

EXAMPLE I

DEFECT REDUCTION IN GaN (a) In a metalorganic chemical vapor deposition chamber at 200°–1200° C., trimethyl gallium is added at a rate of 26 micromol/min, and ammonia gas is added at a rate of 0.1 micromol/min. The reaction chamber is held at 200°–1200° C. at a low pressure of 76 torr for 5 min. The excess and byproduct gases exit the reaction chamber by the exit port. Next, trimethyl gallium and ammonia at the same rates are added to the CVD chamber at a temperature of 200°–1200° C. and an elevated pressure of 760 torr for 50 min. The thin layer of gallium nitride obtained shows significantly reduced level of defects and/or dislocations.

(b) Similarly, when reaction 1(a) is repeated except that the trimethyl gallium is replaced with a stoichiometrically equivalent amount of tributyl gallium, the corresponding layer of gallium nitride obtained has a significantly reduced level of defects and/or dislocations.

(c) Similarly, when reaction 1(a) is repeated except that the trimethyl gallium is replaced with a stoichiometrically equivalent amount of trimethyl indium, the corresponding layer of indium nitride obtained has a significantly reduced level of defects and/or dislocations.

(d) Similarly, when reaction 1(a) is repeated except that the trimethyl gallium is replaced with a stoichiometrically equivalent amount of tributyl indium, the corresponding layer of indium nitride obtained has a significantly reduced level of defects and/or dislocations.

(e) Similarly, when reaction 1(a) is repeated except that the trimethyl gallium is replaced with a stoichiometrically equivalent amount of volatile tri-methyl aluminum, the corresponding layer of aluminum nitride obtained has a significantly reduced level of defects and/or dislocations.

While only a few embodiments of the invention have been shown and described herein, it will become apparent to those skilled in the art that various modifications and changes can be made in the improved method to deposit thin layers of Group III–V nitrides by metalorganic chemical vapor deposition (MOCVD) with a reduced level of defects without departing from the spirit and scope of the present invention. All such modifications and changes coming within the scope of the appended claims are intended to be carried out hereby.

We claim:

1. A method to produce Group III-nitride thin film having a lowered defect density, which method comprises:

(a) combining under metalorganic chemical vapor deposition (MOCVD) conditions at least one Group III metalorganic compound with ammonia, hydrazine, a mixture of nitrogen gas and hydrogen gas, alkylamine or combinations thereof in a molar ratio of between about 1/10000 and 2/1 of metalorganic to ammonia, hydrazine, a mixture of nitrogen gas and hydrogen gas, alkylamine, or combinations thereof at a low pressure of about 100 torr or less, for between about 5 and 60 mins at a temperature of between about 200° and 1200° C., to produce a first Group III metal nitride layer (b) combining under metalorganic chemical vapor deposition conditions at least one Group III metalorganic compound with ammonia, hydrazine, a mixture of nitrogen gas and hydrogen gas, or combinations thereof in a molar ratio of between about 1/10000 and 2/1 metalorganic to ammonia, hydrazine, a mixture of nitrogen gas and hydrogen gas, alkylamine, or combination thereof, at a high pressure of about 500 to 10,000 torr for between about 5 to 60 min at a temperature of between about 200° and 1,200° C. to produce a second Group III metal nitride layer and;

(c) repeating steps (a) and (b) to produce a Group III metal nitride film.

2. The method of claim 1, wherein in the metal organic compound, the organic moiety is an alkyl group having 1 to 6 carbon atoms.

3. The method of claim 1, wherein in step (a) the low pressure is between about 1 and 100 torr.

4. The method of claim 1, wherein in step (a) the temperature is between about 500° and 1200° C.

5. The method of claim 1, wherein in step (b) the high pressure is between about 700° and 10,000 torr.

6. The method of claim 1, wherein in step (b) the temperature is between about 500 and 1,200° C.

7. The method of claim 1 wherein:

in step (a) ammonia is added at a pressure between 1 and 100 torr, the Group III metalorganic compound is trialkyl gallium, the temperature is between about 200° and 1,200° C., and in step (b) the Group III organometallic compound is trialkyl gallium, the temperature is between about 200° and 1,200° C., and the pressure is between about 760 and 10,000 torr.

8. The method of claim 7, wherein in step (a) the temperature is between about 900° and 1,200° C. and in step (b) the temperature is between about 900° and 1,200° C.

9. The method of claim 8, wherein the trialkyl gallium in steps (a) and (b) is trimethyl gallium or triethyl gallium.

10. The method of claim 1 wherein the Group III nitride layer formed in steps (a), (b), and (c) is gallium nitride, indium nitride or aluminum nitride.

11. The method of claim 1 wherein the layer of Group III nitride formed in steps (a), (b) and (c) comprises aluminum indium nitride, aluminum gallium nitride or aluminum gallium indium nitride.

12. The method of claim 1 wherein the metalorganic compound in steps (a) and (b) is trialkyl gallium wherein alkyl is hexyl.

13. The method of claim 1 wherein the Group III metalorganic compound in steps (a) and (b) is trialkyl indium wherein alkyl is methyl or ethyl.

14. The method of claim 1, wherein the Group III metalorganic compound in steps (a) and (b) is trialkyl aluminum, wherein alkyl is methyl or ethyl.

* * * * *